US 8,929,129 B2

(12) United States Patent
Yamamoto

(10) Patent No.: US 8,929,129 B2
(45) Date of Patent: Jan. 6, 2015

(54) SEMICONDUCTOR DEVICE

(71) Applicant: PS4 Luxco S.a.r.l., Luxembourg (LU)

(72) Inventor: Yumiko Yamamoto, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/946,458

(22) Filed: Jul. 19, 2013

(65) Prior Publication Data
US 2014/0028280 A1 Jan. 30, 2014

(30) Foreign Application Priority Data

Jul. 27, 2012 (JP) ................................. 2012-167018

(51) Int. Cl.
| G11C 11/00 | (2006.01) |
|---|---|
| G05F 3/02 | (2006.01) |
| G11C 7/10 | (2006.01) |
| G11C 11/4076 | (2006.01) |
| G11C 11/408 | (2006.01) |
| G11C 11/4091 | (2006.01) |
| G11C 11/4093 | (2006.01) |
| G11C 11/4094 | (2006.01) |
| G11C 11/4096 | (2006.01) |

(52) U.S. Cl.
CPC ................ *G05F 3/02* (2013.01); *G11C 7/1048* (2013.01); *G11C 11/4076* (2013.01); *G11C 11/4087* (2013.01); *G11C 11/4091* (2013.01); *G11C 11/4093* (2013.01); *G11C 11/4094* (2013.01); *G11C 11/4096* (2013.01); *G11C 2207/005* (2013.01)
USPC ........................ 365/154; 365/203; 365/230.06

(58) Field of Classification Search
CPC ............. G11C 7/1048; G11C 11/4076; G11C 11/4093–11/4096; G11C 2207/005
USPC ............ 365/154, 156, 203, 205, 208, 230.06, 365/230.08
See application file for complete search history.

(56) References Cited

U.S. PATENT DOCUMENTS

| 6,771,550 | B2 | 8/2004 | Park | |
|---|---|---|---|---|
| 7,430,147 | B2 * | 9/2008 | Kwack | ........................... 365/203 |
| 7,463,538 | B2 * | 12/2008 | Shin | .............................. 365/203 |
| 8,559,254 | B2 * | 10/2013 | Kim | ............................... 365/203 |

FOREIGN PATENT DOCUMENTS

JP         2003-151276         5/2003

* cited by examiner

*Primary Examiner* — Gene Auduong

(57) ABSTRACT

A device, comprising: first and second signal lines; first and second transistors of first conductivity type coupled in series between first and second signal lines and coupled to each other at first node; third and fourth transistors of second conductivity type coupled in series between first and second lines and coupled to each other at second node; power supply node coupled in common to first and second nodes; fifth transistor of first conductivity type coupled between first and second signal lines; and sixth transistor of second conductivity type coupled between first and second signal lines, wherein each of first, second and fifth transistors is configured to receive first control signal at gate electrode thereof, each of the third and fourth transistors is configured to receive second control signal at gate electrode thereof, and sixth transistor is configured to receive third control signal at gate electrode thereof.

20 Claims, 8 Drawing Sheets

SEMICONDUCTOR DEVICE

REFERENCE TO RELATED APPLICATION

This application is based upon and claims the benefit of priority of Japanese patent application No. 2012-167018, filed on Jul. 27, 2012, the disclosure of which is incorporated herein in its entirety by reference thereto.

TECHNICAL FIELD

The present invention relates to a semiconductor device. More specifically, the invention relates to a semiconductor device including a precharge circuit configured to precharge a main input/output line.

BACKGROUND

In semiconductor devices such as DRAMs (Dynamic Random Access Memories), a precharge circuit configured to precharge a main input/output line to a predetermined voltage is employed.

Patent Literature 1 discloses a semiconductor memory in which a main input/output line (global data line) is precharged to a ½ core potential or a ½ power supply potential. The semiconductor memory disclosed in Patent Literature 1 includes two precharge units between global data lines in order to prevent a precharge potential on the main input/output line from increasing or decreasing from the ½ core potential or the ½ power supply potential when a burst write operation is repeated.

Patent Literature 1

JP Patent Kokai Publication No. JP-P2003-151276A, which corresponds to U.S. Pat. No. 6,771,550B

DISCUSSION OF THE RELATED ART

Each disclosure of the above-listed related art document is incorporated herein by reference. The following analysis has been given by the inventor of the present invention and the like.

In recent years, various precharge circuits and control over the various precharge circuits have been studied in order to achieve area saving and lower power consumption of a data amplifier circuit and a write amplifier circuit. To take an example, a semiconductor device (semiconductor memory) has been studied in which while a main input/output line is precharged to a power supply potential when performing a read operation, the main input/output line is held at a ½ power supply potential during a series of successive write operations (burst write), and then the main input/output line is precharged to the power supply potential when the series of successive write operations is finished. More specifically, during the successive write operations, a pair of main input/output lines that are complementary to each other is just rendered conductive (equalized), and is not connected to a precharge power supply (power supply potential). On the other hand, when the series of successive write operations is finished, the pair of main input/output lines is rendered conductive to each other, and is also connected to the precharge power supply.

In the semiconductor device as described above, the pair of main input/output lines is in a floating state during the successive write operations. Thus, when a current leakage is present in an element or the like connected to the pair of main input/output lines, for example, a write margin may become deficient when a subsequent write operation is performed. Assume, in particular, that a potential on the main input/output line is reduced from the ½ power supply potential when ability of a write amplifier circuit at a time of high-level writing is set to be lower than ability of the write amplifier circuit at a time of a low-level writing. Then, when the subsequent write operation is performed, a high level may not be able to be written due to a shortage of the ability of the write amplifier circuit.

Patent Literature 1 just discloses the semiconductor memory in which a global data line (main input/output line) is precharged to the ½ power supply potential at both times of a read operation and a write operation. That is, the semiconductor memory disclosed in Patent Literature 1 is configured to use the ½ power supply potential as a power supply for the precharge circuits. Thus, in the configuration described in Patent Literature 1, the global data line cannot be precharged to a power supply potential when the series of successive write operations is finished.

SUMMARY

In one aspect of the present disclosure, there is provided a device comprising first and second signal lines; first and second transistors of a first conductivity type coupled in series between the first and second signal lines and coupled to each other at a first node; third and fourth transistors of a second conductivity type coupled in series between the first and second lines and coupled to each other at a second node; a power supply node coupled in common to the first and second nodes; a fifth transistor of the first conductivity type coupled between the first and second signal lines; and a sixth transistor of the second conductivity type coupled between the first and second signal lines. Each of the first, second and fifth transistors is configured to receive a first control signal at a gate electrode thereof, each of the third and fourth transistors is configured to receive a second control signal, that is different from the first control signal, at a gate electrode thereof, and the sixth transistor is configured to receive a third control signal, that is different from the second control signal and complementary to the first control signal, at a gate electrode thereof.

In another aspect of the present disclosure, there is provided a device comprising: a memory cell array including a plurality of memory cells; a plurality of sense amplifiers each coupled to corresponding ones of the memory cells; a plurality of pairs of local input output lines each of the pairs coupled to a corresponding one of the sense amplifiers; a plurality of switches each coupled a corresponding one of the pairs of local input output lines; a first main input output line coupled in common to one of the local input output lines of the pairs of local input output lines with an intervention of the switches; a main input output line coupled in common to the other of the local input output lines of the pairs of local input output lines with an intervention of the switches; first and second transistors of a first conductivity type coupled in series between the first and second signal lines and coupled to each other at a first node; third and fourth transistors of a second conductivity type coupled in series between the first and second lines and coupled to each other at a second node; a power supply node coupled in common to the first and second nodes; a fifth transistor of the first conductivity type coupled between the first and second signal lines; and a sixth transistor of the second conductivity type coupled between the first and second signal lines. Each of the first, second and fifth transistors is configured to receive a first control signal at a gate electrode thereof, each of the third and fourth transistors is configured to receive a second control signal, that is different from the first control signal, at a gate electrode thereof, and the sixth transistor is configured to receive a third control signal, that is different from the second control signal and complementary to the first control signal, at a gate electrode thereof.

In still another aspect of the present disclosure, there is provided a device, comprising; first and second signal lines; first and second transistors of a first conductivity type coupled in series between the first and second signal lines and coupled to each other at a first node; third and fourth transistors of a second conductivity type coupled in series between the first and second lines and coupled to each other at a second node; a power supply node coupled in common to the first and second nodes; a fifth transistor of the first conductivity type coupled between the first and second signal lines; and a sixth transistor of the second conductivity type coupled between the first and second signal lines. The sixth transistor is configured to be rendered conductive when the first, second and fifth transistors are rendered conductive while the third and fourth transistors are non conductive.

PREFERRED MODES

First, a specific exemplary embodiment will be described below in further detail, with reference to drawings.

First Exemplary Embodiment

A first exemplary embodiment will be described in more detail using drawings.

Figure 2:
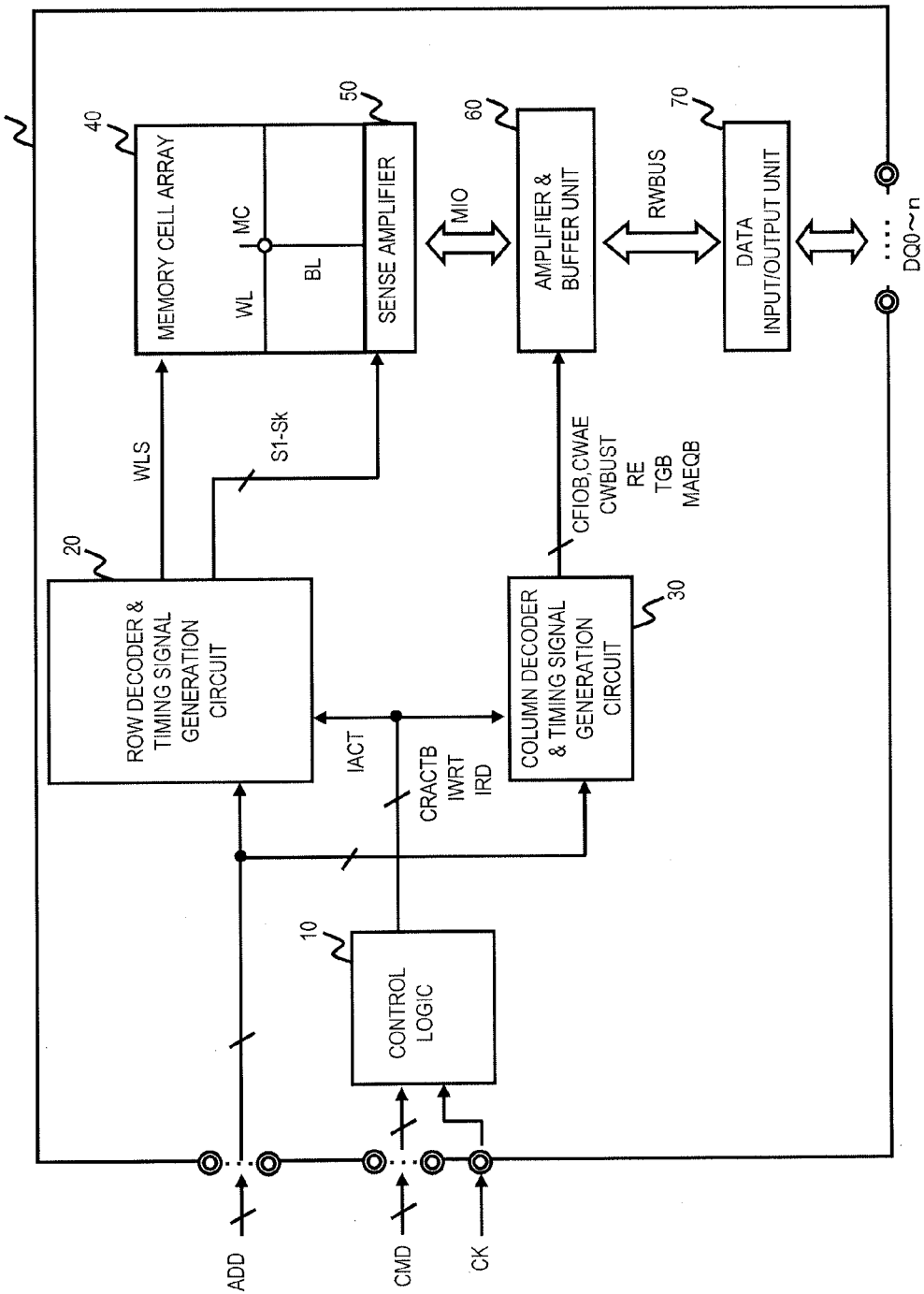
FIG. 2 is a diagram showing an example of an overall configuration of the semiconductor device 1 according to the first exemplary embodiment.

FIG. 2 is a diagram showing an example of an overall configuration of a semiconductor device 1 according to this exemplary embodiment.

The semiconductor device 1 is configured to include a control logic 10, a row decoder & timing signal generation circuit 20, a column decoder & timing signal generation circuit 30, a memory cell array 40, a sense amplifier 50, an amplifier & buffer unit 60, and a data input/output unit 70.

The control logic 10 receives a command supplied from an outside, and then generates various internal signals. Specifically, when an active command is supplied from the outside, the control logic 10 generates an internal active command signal IACT and a column-system internal active signal CRACTB.

Further, when a read command is supplied from the outside, the control logic 10 generates an internal read command signal IRD. When a write command is supplied from the outside, the control logic 10 generates an internal write command signal IWRT. The internal active command signal IACT is output to the row decoder & timing signal generation circuit 20. The column-system internal active signal CRACTB, the internal read command signal IRD, and the internal write command signal IWRT are output to the column decoder & timing signal generation circuit 30.

The internal active command signal IACT holds an active high level until a precharge command is supplied from the outside. The column-system internal active signal CRACTB transitions to an active low level, in response to the active command, and transitions to an inactive high level, in response to supply of the precharge command.

The row decoder & timing signal generation circuit 20 receives address signals ADD as a row address, in response to the internal active command signal IACT. The row decoder & timing signal generation circuit 20 outputs various row system control signals, in response to the internal active command signal IACT and the row address. Specifically, the row decoder & timing signal generation circuit 20 outputs a word line selection signal WLS to the memory cell array 40, and outputs switch control signals S1 to Sk (k being an integer of one or more) to the sense amplifier 50.

The column decoder & timing signal generation circuit 30 is activated, in response to the column-system internal active signal CRACTB. When the internal read command signal IRD is supplied, the column decoder & timing signal generation circuit 30 receives address signals ADD as a column address, in response to the internal read command signal IRD. The column decoder & timing signal generation circuit 30 outputs various column-system control signals, in response to the internal read command signal IRD and the column address. Specifically, the column decoder & timing signal generation circuit 30 outputs a main input/output line equalize instruction signal CFIOB, a write enable signal CWAE, a burst write status signal CWBUST, a read enable signal RE, a main amplifier connection signal TGB, and a main amplifier equalize signal MAEQB to the amplifier & buffer unit 60.

The column decoder & timing signal generation circuit 30 drives the read enable signal RE to an active high level and drives the main amplifier connection signal TGB to an active low level, in response to the internal read command signal IRD. The column decoder & timing signal generation circuit 30 drives the main amplifier equalize signal MAEQB from an active low level to an inactive high level in response to the internal read command signal IRD, and keeps the main amplifier equalize signal MAEQB at the high level for a determined period.

Further, the column decoder & timing signal generation circuit 30 drives the main input/output line equalize instruction signal CFIOB to an active high level, in response to the internal read command signal IRD. The main input/output line equalize instruction signal CFIOB is a signal for instructing execution of equalizing a pair of main input/output lines when a read operation is finished. The burst write status signal CWBUST and the write enable signal CWAE are both maintained at inactive low levels.

The column decoder & timing signal generation circuit 30 receives the address signals ADD as the column address, in response to the internal write command signal IWRT. The column decoder & timing signal generation circuit 30 outputs the write enable signal CWAE, in response to the internal write command signal IWRT and the column address.

The burst write status signal CWBUST is a signal indicating execution of a burst write operation. Specifically, the burst write status signal CWBUST is a signal that is activated in response to the internal write command signal IWRT which is first supplied after the column-system internal active signal CRACTB has been activated. Once activated, the burst write status signal CWBUST is maintained at an active high level until the column-system internal active signal CRACTB is inactivated or the read command is supplied. On the other hand, logic levels of the main input/output line equalize instruction signal CFIOB, the read enable signal RE, the main amplifier connection signal TGB, and the main amplifier equalize signal MAEQB are not changed, in response to the internal write command signal IWRT.

The memory cell array 40 includes a plurality of word lines WL, a plurality of bit lines BL, and a plurality of memory cells MC provided at intersections between the respective word lines WL and the respective bit lines BL. The sense amplifier 50 includes a plurality of sense amplifier units. Although FIG. 2 illustrates only one word line WL, only one bit line BL, and only one memory cell MC, a plurality of these word lines WL and the like are actually present.

The amplifier & buffer unit 60 includes a plurality of precharge & equalize circuits PE, a plurality of main amplifiers MA, a plurality of write butter circuits WB, and a main input/output line equalize signal generation circuit MIOEQSC. Details of these circuits will be described later.

When the write command is supplied from the outside, or when a write operation is performed, the data input/output unit 70 supplies write data provided to data terminals DQ to the amplifier & buffer unit 60 through a read/write bus RWBUS. When the read command is supplied from the outside, or when a read operation is performed, the data input/output unit 70 supplies read data provided from the amplifier & buffer unit 60 to the data terminals DQ through the read/write bus RWBUS.

Next, connection among the memory cell array 40, the sense amplifier 50, and the amplifier & buffer unit 60 will be described.

Figure 3:
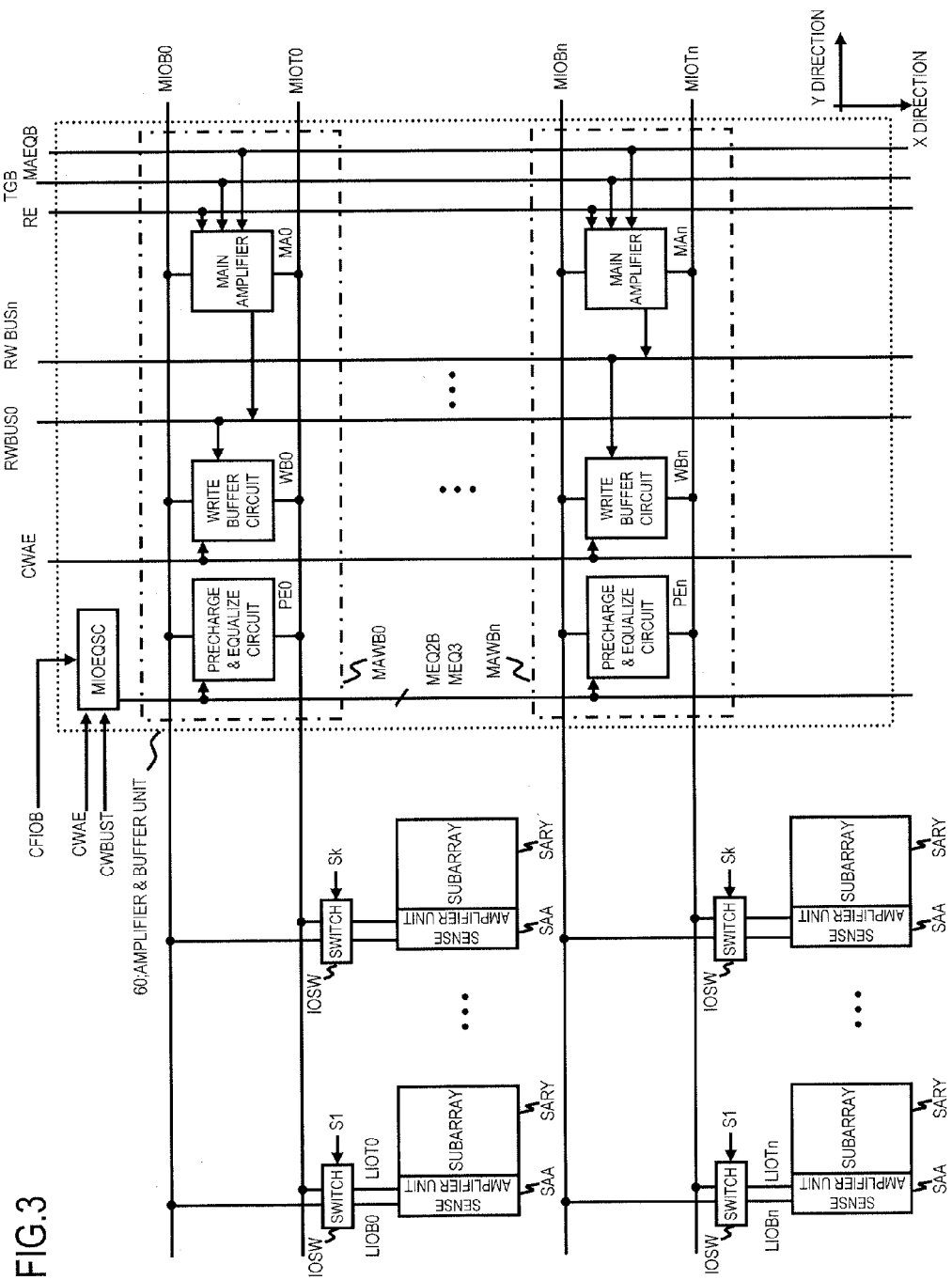
FIG. 3 is a diagram showing an example of connection among a memory cell array 40, a sense amplifier 50, and an amplifier & buffer unit 60.

FIG. 3 is a diagram showing an example of the connection among the memory cell array 40, the sense amplifier 50, and the amplifier & buffer unit 60.

The memory cell array 40 includes a plurality of subarrays SARY. The sense amplifier 50 includes a plurality of sense amplifier units SAA.

Each sense amplifier unit SAA is connected to an input/output switch IOSW via a pair of local input/output lines (LIOT, LIOB). Each input/output switch IOSW is connected between the pair of local input/output lines (LIOT, LIOB) and the pair of main input/output lines (MIOT, MIOB). In response to each of the switch control signals S1 to Sk, connection between the pair of local input/output lines (LIOT, LIOB) and the pair of main input/output lines (MIOT, MIOB) is switched.

A plurality of the subarrays aligned in an X direction of FIG. 3 are simultaneously activated in response to the active command. These subarrays aligned in the X direction may be collectively called a "memory mat". FIG. 3 describes an example including k memory mats. The switch control signals S1 to Sk are respectively supplied to these k memory mats. Which one of the memory mats of the k memory mats is to be activated is specified by a part of the row address.

FIG. 3 describes a plurality of the pairs of main input/output lines (MIOT0, MIOB0) to (MIOTn, MIOBn) and a plurality of the pairs of local input/output lines (LIOT0, LIOB0) to (LIOTn, LIOB0) (n being a positive integer, and the same applies hereinafter). The plurality of the pairs of main input/output lines (MIOT, MIOB) are respectively connected to the plurality of the pairs of local input/output lines (LIOT, MIOB) via the respective input/output switches IOSW.

As described above, the amplifier & buffer unit 60 includes the plurality of precharge & equalize circuits PE, the plurality of main amplifiers MA, and the plurality of write buffer circuits WB. The precharge & equalize circuit PE, the main amplifier MA, and the write buffer circuit WB constitute one set of an amplifier & buffer circuit MAWB. FIG. 3 shows amplifier & buffer circuits MAWB0 to MAWBn.

The precharge & equalize circuit PE, the write buffer circuit WB, and the main amplifier MA are connected to each pair of main input/output lines (MIOT, MIOB). The amplifier & buffer unit 60 further includes the main input/output line equalize signal generation circuit MIOEQSC.

Figure 4:
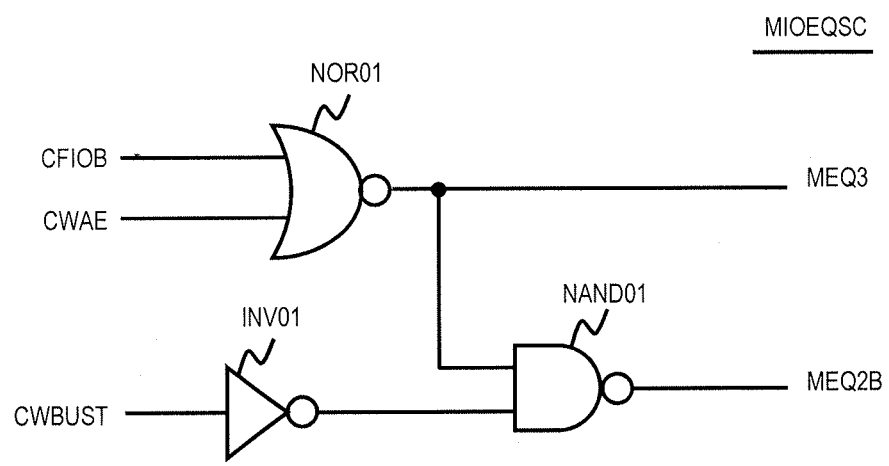
FIG. 4 is a diagram showing an example of a configuration of a main input/output line equalize signal generation circuit MIOEQSC.

FIG. 4 is a diagram showing an example of a configuration of the main input/output line equalize signal generation circuit MIOEQSC. The main input/output line equalize signal generation circuit MIOEQSC receives the main input/output line equalize instruction signal CFIOB, the write enable signal CWAE, and the burst write status signal CWBUST, and then generates main input/output line equalize signals MEQ2B and MEQ3.

The main input/output line equalize signal generation circuit MIOEQSC is configured to include a NOR circuit NOR01, an inverter circuit INV01, and a NAND circuit NAND01.

When the main input/output line equalize instruction signal CFIOB is at an active low level and the write enable signal CWAE is at the inactive level (low level), the main input/output line equalize signal generation circuit MIOEQSC drives the main input/output line equalize signal MEQ3 to an active high level. On the other hand, when the main input/output line equalize instruction signal CFIOB is at the inactive high level or the write enable signal CWAE is at an active high level, the main input/output line equalize signal generation circuit MIOEQSC drives the main input/output line equalize signal MEQ3 to an inactive low level.

The main input/output line equalize signal generation circuit MIOEQSC drives the main input/output line equalize signal MEQ2B to an inactive high level when the main input/output line equalize signal MEQ3 is at the high level or a signal obtained by inverting the burst write status signal CWBUST is at a high level. On the other hand, when the main input/output line equalize signal MEQ3 and the signal obtained by inverting the burst write status signal CWBUST are both at the high levels, the main input/output line equalize signal generation circuit MIOEQSC drives the main input/output line equalize signal MEQ2B to an active low level. Both of the main input/output line equalize signals MEQ2B and MEQ3 are supplied to the precharge & equalize circuit PE.

Next, an internal configuration and operation of the amplifier & buffer circuit MAWB0 will be described, using the amplifier & buffer circuit MAWB0 as an example. Since configurations and operations of the other amplifier & buffer circuits MAWB are the same as those of the amplifier & buffer circuit MAWB0, description of the configurations and operations of the other amplifier & buffer circuits MAWB will be omitted.

The precharge & equalize circuit PE0 short-circuits and connects the pair of the main input/output lines (MIOT0, MIOB0) to a potential VIO, in response to the main input/output line equalize signals MEQ2B and MEQ3 generated by the main input/output line equalize signal generation circuit MIOEQSC, thereby substantially equalizing a potential on the pair of the main input/output lines (MIOT0, MIOB0) to the potential VIO. The potential VIO is equal to a supply voltage at which the amplifier & buffer unit 60 is operated.

The write buffer circuit WB0 drives the pair of the main input/output lines (MIOT0, MIOB0) to a logic level corresponding to write data supplied through the read/write bus RWBUS0, in response to the write enable signal CWAE.

The main amplifier MA0 is connected to the pair of the main input/output lines (MIOT0, MIOB0), in response to the main amplifier connection signal TGB. Specifically, the main amplifier MA0 is disconnected from the pair of the main input/output lines (MIOT0, MIOB0) when a write operation is performed, and is connected to the pair of the main input/output lines (MIOT0, MIOB0) when a read operation is performed. Further, the main amplifier MA0 drives the read/write bus RWBUS0 to a logic level corresponding to read data supplied through the pair of the main input/output lines (MIOT0, MIOB0), in response to the read enable signal RE.

Next, each circuit included in the amplifier & buffer circuit MAWB0 will be described.

Figure 1:
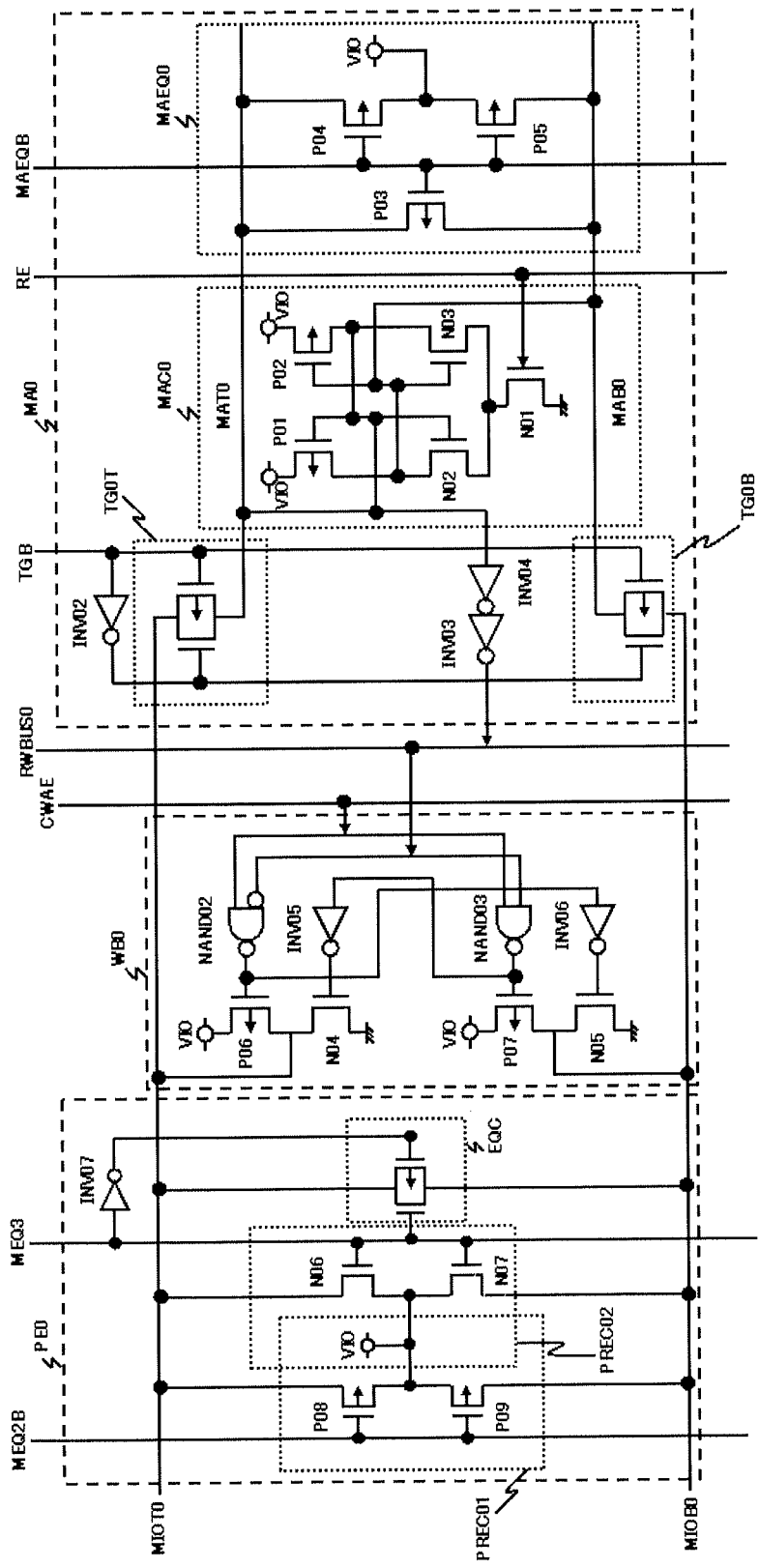
FIG. 1 is a diagram showing an example of a circuit configuration of an amplifier & buffer circuit MAWB0 included in a semiconductor device 1 according to a first exemplary embodiment.

FIG. 1 is a diagram showing an example of the amplifier & buffer circuit MAWB0. The main amplifier MA0 is configured to include two transfer gates TG0T and TG0B, a main amplifier circuit MAC0, and a main amplifier equalize circuit MAEQ0.

When the main amplifier connection signal TGB is at the active low level, the transfer gates TG0T and TG0B are rendered conductive to respectively connect two input nodes MAT0 and MAB0 of the main amplifier circuit MAC0 to the main input/output lines (MIOT0, MIOB0) of the pair. The main amplifier connection signal TGB is logically inverted by an inverter circuit INV02 and is then connected to one end of the transfer gate TG01 and one end of the transfer gate TG0B.

The main amplifier circuit MAC0 is constituted from three N-channel type MOS transistors N01 to N03 and two P-channel type MOS transistors P01 and P02. When the read enable signal RE is at the active high level, the main amplifier circuit MAC0 amplifies a potential difference between the two input nodes MAT0 and MAB0 of the main amplifier circuit MAC0, and drives the read/write bus RWBUS0 via the input node MAT0 and a common output node of the main amplifier circuit MAC0 according to the amplified potential difference. The output node of the main amplifier circuit MAC0 and the read/write bus RWBUS0 are connected via the two inverter circuits INV03 and INV04.

In the semiconductor device 1 in this exemplary embodiment, ability of the inverter circuit INV03 for driving the read/write bus RWBUS0 is set to be lower than ability of a data input circuit of the data input/output unit 70 for driving the read/write bus RWBUS0, thereby preventing write data to be broken. Instead of taking into consideration a balance between the abilities of the inverter circuit INV03 and the data input circuit as described above, the following configuration can also be set. That is, a part of the read/write bus RWBUS0 on the side of the amplifier & buffer unit 60 is branched into a write bus WBUS0 connected to the write buffer circuit WB0 and a read bus RBUS0 connected to the main amplifier circuit MAC0. Then, a relay circuit is disposed at the branched portion of the read/write bus RWBUS0. When a write operation is performed, the write bus WBUS0 and the read/write bus RWBUS0 are selectively connected. On the other hand, when a read operation is performed, the read bus RBUS0 is selectively connected to the read/write bus RWBUS0. With this arrangement, write data is prevented from being broken.

The main amplifier equalize circuit MAEQ0 is constituted from three P-channel type MOS transistors P03 to P05. When the main amplifier equalize signal MAEQB is at the active low level, the main amplifier equalize circuit MAEQ0 short-circuits and connects the two input nodes MAT0 and MAB0 of the main amplifier circuit MAC0 to the potential VIO, thereby substantially equalizing the potentials at the two input nodes MAT0 and MAB0 of the main amplifier circuit MAC0 to the potential VIO.

The write buffer circuit WB0 is constituted from two N-channel type MOS transistors N04 and N05, two P-channel type MOS transistors P06 and P07, two NAND circuits NAND02 and NAND03, and two inverter circuits INV05 and INV06. A signal obtained by logically inverting a signal on the read/write bus RQBUS0 is supplied to one end of inputs of the NAND circuit NAND02.

As described above, the write buffer circuit WB0 drives the pair of the main input/output lines (MIOT0, MIOB0) to the logic level corresponding to the write data supplied through the read/write bus RWBUS0, in response to the write enable signal CWAE. Current driving ability of each P-channel type MOS transistor included in the write buffer circuit WB0 is set to be lower than current driving ability of each N-channel type MOS transistor in the write buffer circuit WB0. With this configuration, area saving of the write buffer circuit WB0 is achieved. For that reason, the write buffer circuit WB0 is so configured that ability of the write buffer circuit WB0 for high-level writing is weaker than that for low-level writing and a greater margin is needed for the high-level writing. The write buffer circuit to be used for the semiconductor device 1 in this exemplary embodiment is not, however, limited to such a configuration.

The precharge & equalize circuit PE0 is configured to include a first precharge circuit PREC01, a second precharge circuit PREC02, an equalize circuit EQC, and an inverter circuit INV07.

The first precharge circuit PREC01 is configured to include P-channel type MOS transistors P08 and P09. The second precharge circuit PREC02 is configured to include N-channel type MOS transistors N06 and N07. The equalize circuit EQC is configured to include a transfer gate. When the main input/output line equalize signal MEQ3 is at the active high level, the equalize circuit EQC is rendered conductive, thereby short-circuiting the pair of the main input/output lines (MIOT0, MIOB0). The main input/output line equalize signal MEQ3 is logically inverted by the inverter circuit INV07, and is supplied to one end of the transfer gate included in the equalize circuit EQC.

The second precharge circuit PREC02 precharges the pair of the main input/output lines (MIOT0, MIOB0), in response to the main input/output line equalize signal MEQ3. The first precharge circuit PREC01 precharges the pair of the main input/output lines (MIOT0, MIOB0), in response to the main input/output line equalize signal MEQ2B.

Current driving ability of the first precharge circuit PREC01 when activated is set to be larger than current driving ability of the second precharge circuit PREC02 when activated.

Since the first precharge circuit PREC01 is constituted from the plurality of the P-channel type MOS transistors, the first precharge circuit PREC01 drives the pair of the main input/output lines (MIOT0 and MIOB0) to the potential substantially equal to the potential VIO when the first precharge circuit PREC01 is activated (drives the pair of the main input/output lines (MIOT0 and MIOB0) to the potential V10).

On the other hand, since the second precharge PREC02 is constituted from the plurality of the N-channel type MOS transistors, the pair of the main input/output lines (MIOT0 and MIOB0) cannot be raised to the potential VIO even if the second precharge circuit PREC02 is activated. The second precharge circuit PREC02 just raises the pair of the main input/output lines (MIOT0, MIOB0) to a potential obtained by subtracting Vnth (threshold voltage of each of the N-channel type MOS transistors N06 and N07) from the potential VIO (high level of the main input/output line equalize signal MEQ3)

The main input/output line equalize signals MEQ2B and MEQ3 are controlled so that the equalize circuit EQC and the second precharge circuit PREC02 are activated and the first precharge circuit PREC01 is inactivated during respective write operations of the burst write operation. By activating the second precharge circuit PREC02, the pair of the main input/output lines (MIOT0, MIOB0) is connected to the potential VIO via the second precharge circuit PREC02. For that reason, even if a current leakage occurs in the pair of the local input/output lines (LIOT0, LIOB0) connected to the pair of the main input/output lines (MIOT0, MIB0) or the like, and a potential on the pair of the main input/output lines (MIOT0, MIOB0) decreases, the pair of the main input/output lines (MIOT0, MIOB0) is connected to the potential VIO through the second precharge circuit PREC02. Thus, the potential on the pair of the main input/output lines (MIOT0, MIOB0) can be maintained to be higher than a ½ potential VIO.

As a result, the potential on the pair of the main input/output lines (MIOT0, MIOB0) can be maintained to be higher than the ½ potential VIO even if high-level writing ability is set to be lower than low-level writing ability as in the write buffer circuit WB0 of the semiconductor device 1 in this embodiment. Thus, a margin at a time of a subsequent write operation will not be reduced.

Further, the current driving ability of each N-channel type MOS transistor included in the second precharge circuit PREC02 is set to be lower than the current driving ability of each P-channel type MOS transistor included in the first precharge circuit PREC01. Thus, the potential on the pair of the main input/output lines (MIOT0, MIOB0) do not abruptly rise, and remains in the vicinity of the ½ potential VIO.

The main input/output line equalize signals MEQ2B and MEQ3 are controlled so that, in addition to the second precharge circuit PREC02, the first precharge circuit PREC01 is activated when the burst write operation is finished. As a result, the pair of the main input/output lines (MIOT0, MIOB0) can be precharged to the potential VIO at high speed.

The channel width (W size) of each transistor constituting the precharge & equalize circuit PE0 will be described. It is assumed that the channel length (L size) of each transistor constituting the precharge & equalize circuit PE0 is substantially the same.

Preferably, the channel width of each N-channel type MOS transistor constituting the second precharge circuit PREC02 is a minimum channel width allowable on a design basis. On the other hand, preferably, the channel width of each P-channel type MOS transistor constituting the first precharge circuit PREC01 is at least longer (W size is larger) than the minimum channel width allowable on the design basis. Preferably, the channel width of each P-channel type MOS transistor constituting the first precharge circuit PREC01 is determined according to a speed or the allowable range of a precharge potential necessary for equalizing the pair of the main input/output lines (MIOT0, MIOB0). More specifically, it is preferable that a result of simulation to be carried out when designing the semiconductor device 1 be taken into consideration and that the channel width of each P-channel type MOS transistor constituting the first precharge circuit PREC01 be appropriately adjusted In the light of the above relationship, the channel width of each transistor constituting the precharge & equalize circuit PE0 can be set as follows. The channel width of each of the N-channel type MOS transistors N01 and N02 is set to 0.6 µm. The channel width of each of the P-channel type MOS transistors P01 and P02 is set to 12 µm. The channel width of the N-channel type MOS transistor of the transfer gate constituting the precharge & equalize circuit PE0 is set to 8 µm, while the channel width of the P-channel type MOS transistor of the transfer gate constituting the precharge & equalize circuit PE0 is set to 16 µm.

The numerical values mentioned above are just an example. In the semiconductor device 1 in this exemplary embodiment, the channel width of each transistor included in each precharge circuit may be of any size if values of the current driving abilities of the first and second precharge circuits PREC01 and PREC02 satisfy the above-mentioned relationship.

Next, operation of the semiconductor device 1 will be described.

Figure 5:
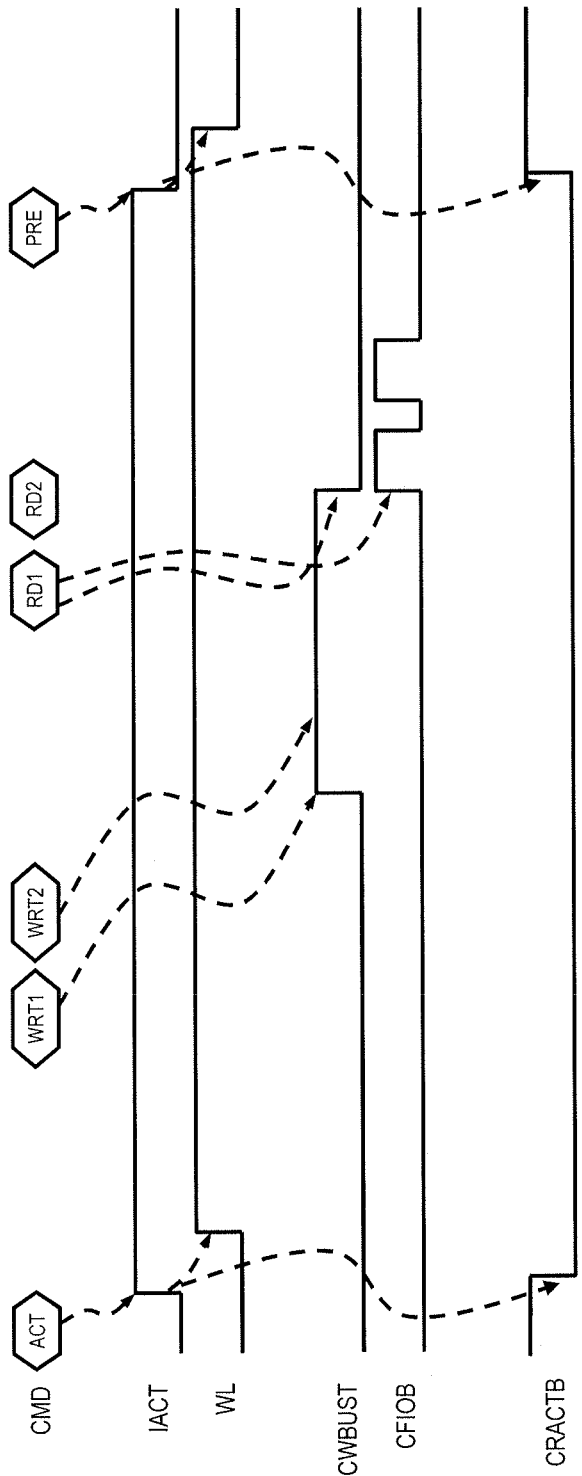
FIG. 5 is a waveform diagram showing an example of an outline of operation of the semiconductor device 1.

FIG. 5 is a waveform diagram showing an example of an outline of the operation of the semiconductor device 1.

Referring to FIG. 2, when an active command ACT is supplied from the outside, the control logic 10 transitions the internal active command signal IACT from an inactive low level to the active high level, and then maintains the internal active command signal IACT at the active high level.

Then, the row decoder & timing signal generation circuit 20 transitions the word line WL specified by a row address supplied together with the active command ACT to an active high level (selection level) (transitions the word line selection signal WLS to an active high level). The control logic 10 transitions the column-system internal active signal CRACTB from the inactive high level to the active low level, due to supply of the active command ACT.

When a write command WRT1 is supplied from the outside, the column decoder & timing signal generation circuit 30 transitions the burst write status signal CWBUST from an inactive low level to the active high level. Even when a write command WRT2 is supplied following the write command WRT1, the column decoder & timing signal generation circuit 30 maintains the burst write status signal CWBUST at the high level.

When read commands RD1 and RD2 are supplied from the outside, the column decoder & timing signal generation circuit 30 transitions the main input/output line equalize instruction signal CFIOB to the inactive high level. Then, when each read operation is finished, the column decoder & timing signal generation circuit 30 transitions the main input/output line equalize instruction signal CFIOB to the active low level. As a result, each time after the read operation in response to each of the read commands RD1 and RD2 is finished, the pair of the main input/output lines (MIOT, MIOB) is equalized. In other words, by the transition of the main input/output line equalize instruction signal CFIOB to the low level, the main input/output line equalize signal MEQ3 transitions to the active high level. Simultaneously, the burst write status signal CWBUST transitions to the inactive low level, in response to the read command RD1. Thus, the main input/output line equalize signal MEQ2B also transitions to the active low level. That is, the main input/output line equalize signals MEQ2B and MEQ3 are both activated, so that the pair of the main input/output lines (MIOT, MIOB) is equalized.

Then, when a precharge command PRE is supplied from the outside, the control logic 10 transitions the internal active command signal TACT from the active high level to the inactive low level. In response to the transition of the internal active command signal IACT from the high level to the low level, the low decoder & timing signal generation circuit 20 transitions the word line WL that has been at the active high level (selection level) to an inactive low level. Further, in response to supply of the precharge command PRE, the control logic 10 transitions the column-system internal active signal CRACTB to the inactive high level.

Next, details of a write operation will be described.

Figure 6:
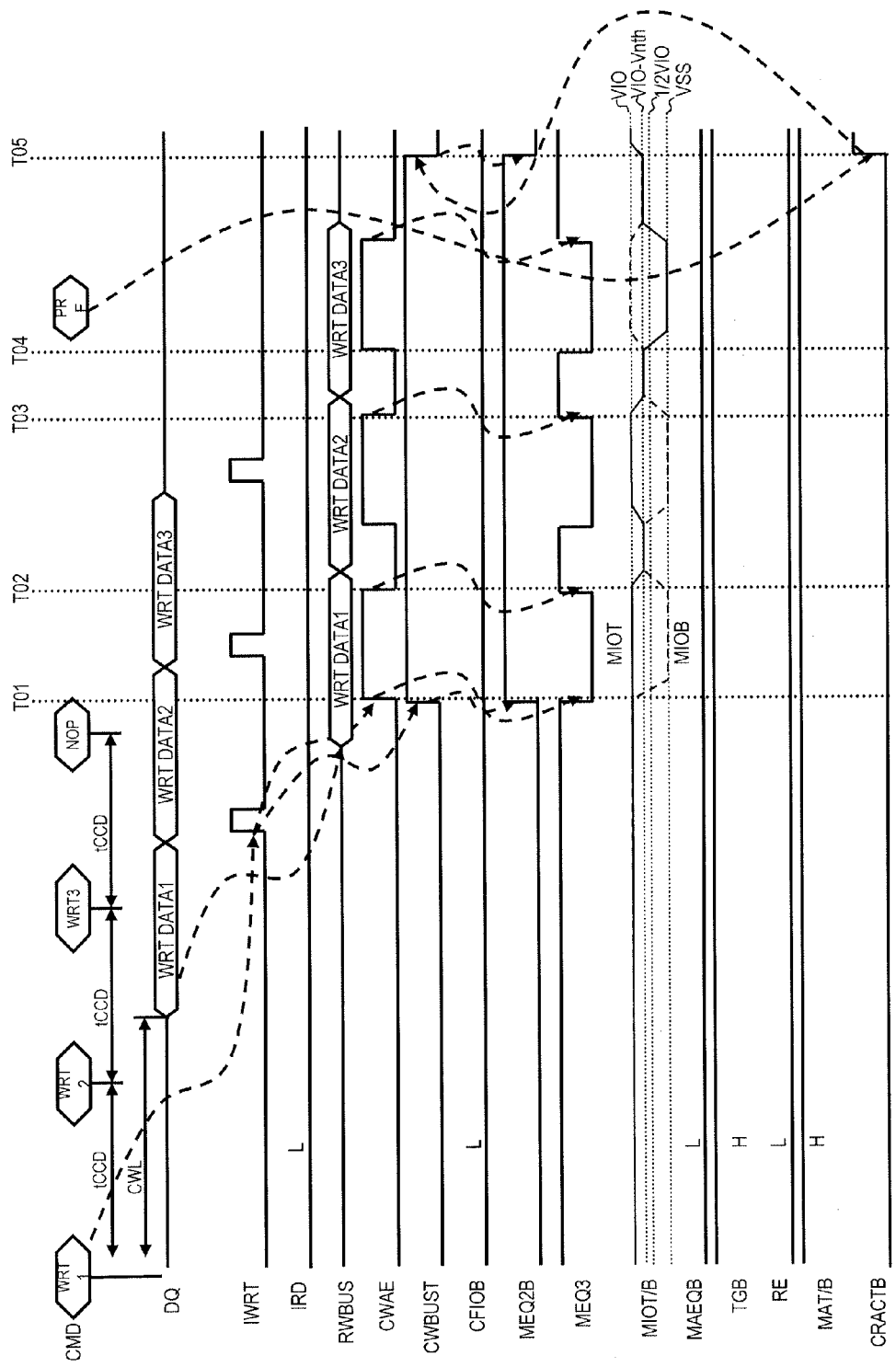
FIG. 6 is a diagram showing an example of waveforms when write commands are successively supplied.

FIG. 6 is a diagram showing an example of waveforms when write commands are successively supplied.

Referring to FIG. 6, the write command WRT1, the write command WRT2, and a write command WRT3 are successively supplied from the outside at intervals of a period tCCD.

FIG. 6 shows the waveforms of operations after the active command ACT has been supplied from the outside, a specific one of a plurality of memory mats has been specified by a row address, the word line WL of the specified memory mat specified by the row address has been selectively activated, and then the input/output switch IOSW corresponding to the selected word line WL has been turned on.

When the write command WRT1 is supplied from the outside, the control logic 10 generates the internal write command signal IWRT after the lapse of a predetermined delay period. After the lapse of a CWL (CAS write latency) from issuance of the write command WRT1, write data WRTE DATA1 is supplied from the outside.

The write data WRITE DATA1 is transferred to the read/write bus RWBUS0 via the data input/output unit 70.

The column decoder & timing signal generation circuit 30 drives the write enable signal CWAE and the burst write status signal CWBUST to the active high levels, in response to the internal write command signal IWRT generated by the control logic 10 (at a time T01).

The write buffer circuit WB included in the amplifier & buffer circuit MAWB is activated, in response to the write enable signal CWAE activated by the column decoder & timing signal generation circuit 30, and then, the pair of the main input/output lines (MIOT, MIOB) and the pair of the local input/output lines (LIOT, LIOB) are driven, according to the logic level of the write data WRITE DATA1 on the read/write bus RWBUS0. The pair of the local input/output lines (LIOT, LIOB) driven according to the logic level of the write data WRITE DATA1 is connected to the memory cell MC via the sense amplifier unit SAA and the bit line BL. Then, the write data WRITE DATA1 is written to the predetermined memory cell MC.

On the other hand, the main input/output line equalize signal MEQ3 transitions to the inactive low level, in response to the activation of the write enable signal CWAE (at the time T01). Further, the main input/output line equalize signal MEQ2B also transitions to the inactive high level, by the transition of the main input/output equalize signal MEQ3 to the low level. Accordingly, during the write operation (from the time T01 to a time T02), each of the first precharge circuit PREC01, the second precharge circuit PREC02, and the equalize circuit EQC is inactive.

Then, when the write operation is finished, the column decoder & timing signal generation circuit 30 transitions the write enable signal CWAE to the inactive low level (at the time T02). In response to the transition of the write enable signal CWAE to the inactive low level, the main input/output line equalize signal MEQ3 transitions to the active high level. On the other hand, the main input/output line equalize signal MEQ2B maintains the inactive high level.

As a result, the second precharge circuit PREC02 and the equalize circuit EQC are both activated, but the first precharge circuit PREC01 keeps inactive.

Operations that are the same as those described above are executed for each of the write commands WRT2 and WRT3 as well. However, since the column address is updated, write data is written to the different memory cell MC. When performing writing in response to the write command WRT3, write data WRITE DATA3 is inverted from the write data WRITE DATA1 and WRITE DATA2 (in a period from times T03 to T04).

Since a subsequent write command WRT is not supplied after the lapse of the period tCCD from issuance of the write command WRT3 (nonoperation command is supplied in FIG. 6), the control logic 10 does not generate the internal write command signal IWRT. Further, in response to supply of the precharge command PRE from the outside, the control logic 10 transitions the column-system internal active signal CRACTB to the inactive high level (at a time T05).

The burst write status signal CWBUST is activated in response to generation of the internal write command signal IWRT associated with the write command WRT1. Since the burst write status signal CWBUST has been once activated, the logic level of the burst write status signal CWBUST is not changed (the burst write status signal CWBUST maintains the active level) even if the write commands WRT2 and WRT3 are successively supplied at the intervals of the period tCCD. However, in response to the supply of the precharge command PRE from the outside and the transition of the column-system internal active signal CRACTB to the inactive high level, the burst write status signal CWBUST transitions to the inactive low level (at the time T05).

Since the burst write status signal CWBUST transitions to the inactive low level at the time T05, the main input/output line equalize signal MEQ2B transitions from the inactive high level to the active low level. In other words, the pair of the main input/output lines (MIOT, MIOB) is equalized by the first precharge circuit PREC01 and the second precharge circuit PREC02 after the write operation in response to the write command WRT3 has been finished.

Next, details of a read operation of the semiconductor device 1 will be described.

Figure 7:
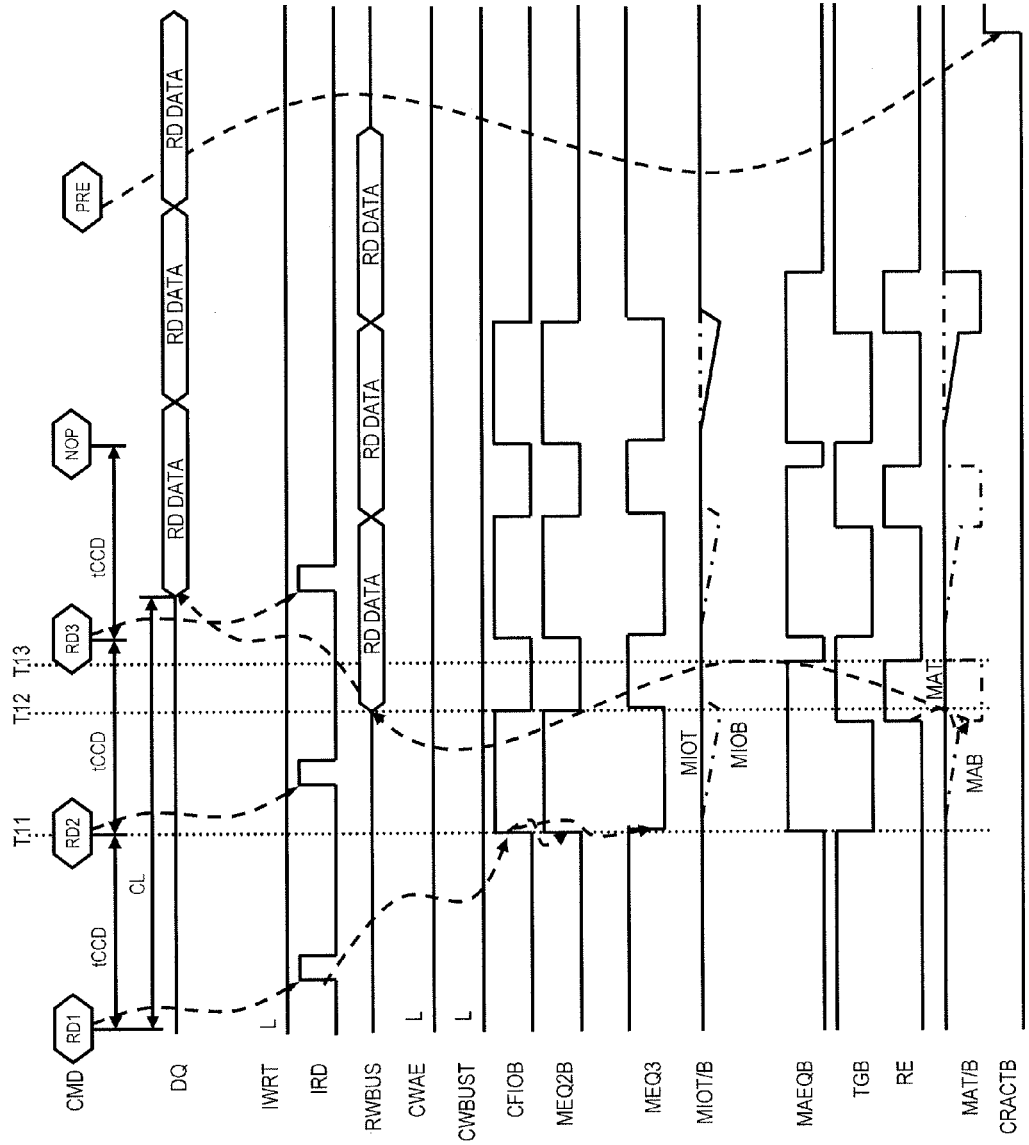
FIG. 7 is a diagram showing an example of waveforms when read commands are successively supplied.

FIG. 7 is a diagram showing an example of waveforms when read commands are successively supplied.

Referring to FIG. 7, the read command RD1, the read command RD2, and a read command RD3 are successively supplied from the outside at the intervals of the period tCCD.

FIG. 7 shows the waveforms of operations after the active command ACT has been supplied from the outside, a specific one of the plurality of memory mats has been specified by a row address, the word line WL of the specified memory mat specified by the row address has been selectively activated, and the input/output switch IOSW corresponding to the selected word line WL has been turned on.

When the read command RD1 is supplied from the outside, the control logic 10 generates the internal read command signal IRD. The control logic 10 causes the burst write status signal CWBUST to maintain the inactive low level.

In response to the internal read command signal IRD generated by the control logic 10, the column decoder & timing signal generation circuit 30 generates the main amplifier connection signal TGB, and also transitions the main amplifier equalize signal MAEQB from the active low level to the inactive high level (at a time T11). Simultaneously, the column decoder & timing signal generation circuit 30 transitions the main input/output equalize instruction signal CFIOB from the active low level to the inactive high level.

In response to transition of the main amplifier connection signal TGB to the low level, the main amplifier MA is connected to the pair of the main input/output lines (MIOT, MIOB). Since the main amplifier equalize signal MAEQB is at the inactive high level, an equalize operation is not performed. Since the main input/output line equalize instruction signal CFIOB is at the inactive high level, the main input/output line equalize signal MEQ3 transitions to the inactive low level. Since the main input/output line equalize signal MEQ3 is at the low level, the main input/output line equalize signal MEQ2B also transitions to the inactive high level. Accordingly, the pair of the main input/output lines (MIOT, MIOB) is not equalized because the main input/output line equalize signals MEQ2B and MEQ3 are both at the inactive levels.

In response to the read enable signal RE generated by the column decoder & timing signal generation circuit 30, the main amplifier MA amplifies a potential difference between the pair of the main input/output lines (MIOT, MIOB). The potential difference between the pair of the main input/output lines (MIOT, MIOB) drives the read/write bus RWBUS0, as a logic level associated with read data (at a time T12).

Then, after the elapse of a CL (CAS read latency) from issuance of the read command RD1, read data RD DATA1 is output from the data terminals DQ via the data input/output unit 70. Further, the main input/output line equalize instruction signal CFIOB transitions from the inactive high level to the active low level, in response to finish of the read operation (at a time T12).

By the transition of the main input/output line equalize instruction signal CFIOB to the active low level, the main input/output line equalize signal MEQ3 transitions to the active high level. In response to the transition of the main input/output line equalize signal MEQ3 to the high level, the main input/output equalize signal MEQ2B also transitions to the active low level. Accordingly, the pair of the main input/output lines (MIOT, MIOB) is equalized by the first precharge circuit PREC01 and the second precharge circuit PREC02. Further, in response to the transition of the main amplifier equalize signal MAEQB to the active low level, the main amplifier MA is equalized (at a time T13). Operations that are the same as those are performed for each of the read commands RD2 and RD3.

As described above, at a time of a read operation, whenever the read operation corresponding to each read command is finished, the pair of the main input/output lines (MIOT, MIOB) is equalized and the main amplifier MA is equalized, which gives a difference from the operations at a time of a write operation.

Next, a description will be given about details of operations when a read operation is performed after write operations.

Figure 8:
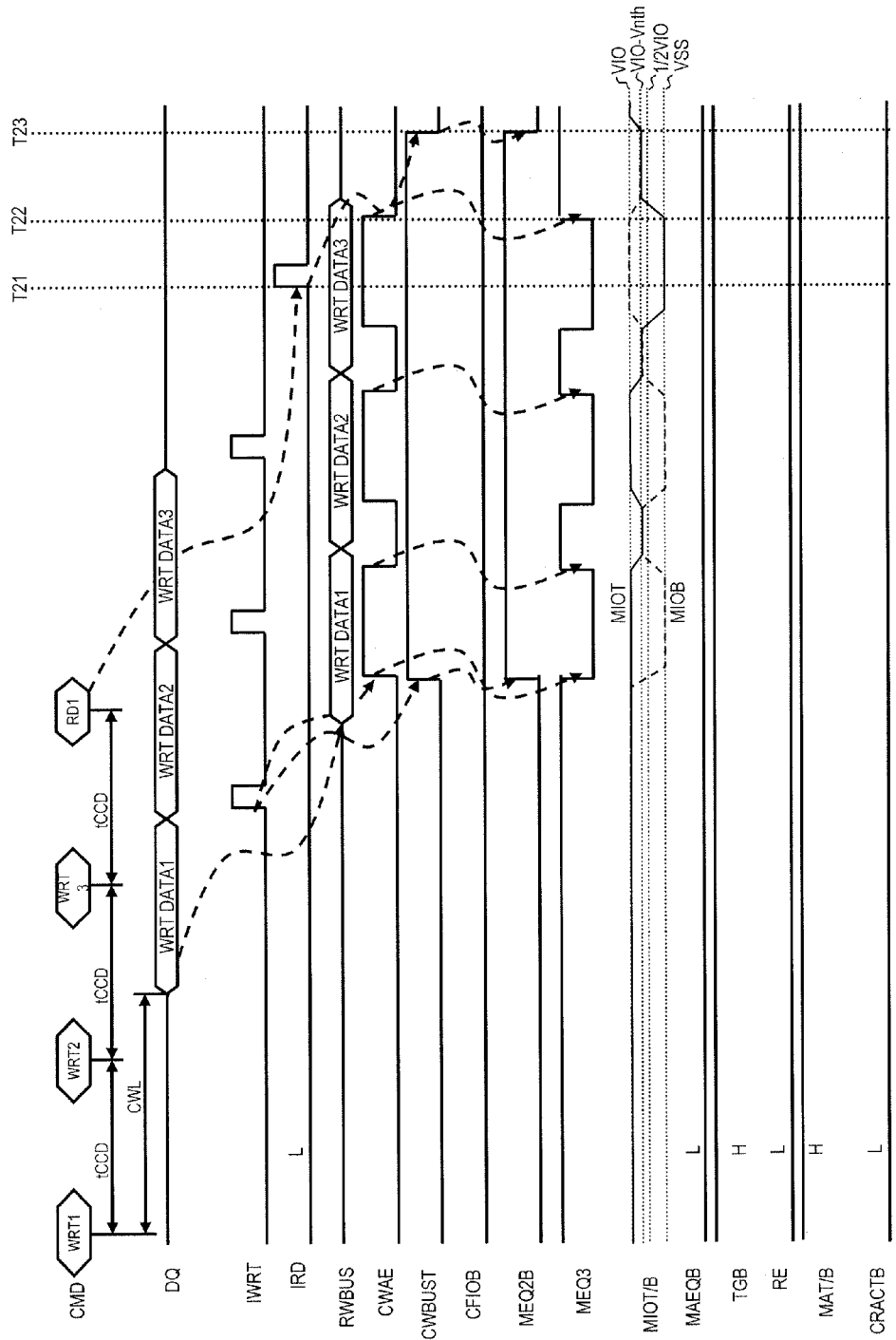
FIG. 8 is a diagram showing an example of waveforms when a read command is supplied after supply of write commands.

FIG. 8 is a diagram showing an example of waveforms when a read command is supplied after supply of write commands.

Referring to FIG. 8, the read command RD1 is supplied after supply of the write commands WRT1 to WRT3 from the outside. Operations in FIG. 8 when the write commands WRT1 to WRT3 are successively supplied are not different from those described using FIG. 6. Thus, description of these operations in FIG. 8 will be omitted.

Referring to FIG. 8, after the period tCCD has elapsed since the write command WRT3 was supplied, the read command RD1 is supplied. Upon receipt of supply of this read command RD1, the control logic 10 transitions the burst write status signal CWBUST from the active high level to the inactive low level (at a time T23). As a result, the main input/output line equalize signal MEQ2B transitions to the active low level.

On the other hand, the main input/output line equalize signal MEQ3 transitions to the active high level, in response to transition of the write enable signal CWAE to the inactive low level (at a time T22). That is, after a write operation in response to the write command WRT3 has been finished, the pair of the main input/output lines (MIOT, MIOB) is equalized by the first precharge circuit PREC01 and the second precharge circuit PREC02.

The control logic 10 generates the internal read command signal IRD, in response to the read command RD1 (at a time T21). A read operation after the internal read command signal IRD has been generated is not different from that described using FIG. 7. Thus, a further description of the read operation in FIG. 8 will be omitted.

As described above, when a burst write of successively writing write data is performed, the first precharge circuit PREC01 is inactivated, and the second precharge circuit PREC02 is activated. Reduction in writing margin during the successive write operations is thereby suppressed while reducing current consumption. Then, when the series of the successive write operations is finished, the first precharge circuit PREC01 is also activated. The pair of the main input/output lines (MIOT, MIOB) can be thereby precharged to the potential VIO at high speed.

The disclosure of the aforementioned Patent Literature is incorporated herein by reference thereto. Modifications and adjustments of the exemplary embodiment are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept. Particularly, any numerical range disclosed herein should be interpreted that any intermediate values or subranges falling within the disclosed range are also concretely disclosed even without specific recital thereof. The P-channel MOS transistor is a typical example of a transistor of a first conductivity type, and the N-channel MOS transistor is a typical example of a transistor of a second conductivity type.

What is claimed is:

1. A device, comprising:
   first and second signal lines;
   first and second transistors of a first conductivity type coupled in series between the first and second signal lines and coupled to each other at a first node;
   third and fourth transistors of a second conductivity type coupled in series between the first and second lines and coupled to each other at a second node;
   a power supply node coupled in common to the first and second nodes;
   a fifth transistor of the first conductivity type coupled between the first and second signal lines; and
   a sixth transistor of the second conductivity type coupled between the first and second signal lines,
   wherein each of the first, second and fifth transistors is configured to receive a first control signal at a gate electrode thereof, each of the third and fourth transistors is configured to receive a second control signal, that is different from the first control signal, at a gate electrode thereof, and the sixth transistor is configured to receive a third control signal, that is different from the second control signal and complementary to the first control signal, at a gate electrode thereof.

2. The device as claimed in claim 1, further comprising;
third and fourth signal lines,
a seventh transistor coupled between the first and third signal lines,
a eight transistor coupled between the second and fourth signal lines,
an amplifying circuit coupled between the third and fourth signal lines to amplify a voltage difference between the third and fourth lines.

3. The device as claimed in claim 1, wherein the first conductivity type is a N-channel type and the second conductivity type is a P-channel type.

4. The device as claimed in claim 1, wherein each of the first and second transistors is smaller in current driving ability than each of the third and fourth transistors.

5. The device as claimed in claim 1, wherein each of the first and second transistors is smaller in channel width than each of the third and fourth transistors.

6. The device as claimed in claim 1, further comprising;
first and second power supply lines configured to be supplied respectively with first and second power supply voltages,
a first driving circuit coupled between the first and second power supply lines and configured to drive the first signal line to one of the first and second power supply voltages,
a second driving circuit coupled between the first and second power supply lines and configured to drive the second signal line to one of the first and second power supply voltages,
wherein the power supply node is coupled to the first power supply line.

7. The device as claimed in claim 6, further comprising;
third and fourth signal lines,
a seventh transistor coupled between the first and third signal lines,
a eight transistor coupled between the second and fourth signal lines,
an amplifying circuit coupled between the third and fourth signal lines to amplify a voltage difference between the third and fourth lines.

8. The device as claimed in claim 6, wherein the first conductivity type is a N-channel type and the second conductivity type is a P-channel type.

9. The device as claimed in claim 6, wherein each of the first and second transistors is smaller in current driving ability than each of the third and fourth transistors.

10. The device as claimed in claim 6, wherein each of the first and second transistors is smaller in channel width than each of the third and fourth transistors.

11. A device, comprising:
a memory cell array including a plurality of memory cells;
a plurality of sense amplifiers each coupled to corresponding ones of the memory cells;
a plurality of pairs of local input output lines each of the pairs coupled to a corresponding one of the sense amplifiers;
a plurality of switches each coupled a corresponding one of the pairs of local input output lines;
a first main input output line coupled in common to one of the local input output lines of the pairs of local input output lines with an intervention of the switches;
a main input output line coupled in common to the other of the local input output lines of the pairs of local input output lines with an intervention of the switches;
first and second transistors of a first conductivity type coupled in series between the first and second signal lines and coupled to each other at a first node;
third and fourth transistors of a second conductivity type coupled in series between the first and second lines and coupled to each other at a second node;
a power supply node coupled in common to the first and second nodes;
a fifth transistor of the first conductivity type coupled between the first and second signal lines; and
a sixth transistor of the second conductivity type coupled between the first and second signal lines,
wherein each of the first, second and fifth transistors is configured to receive a first control signal at a gate electrode thereof, each of the third and fourth transistors is configured to receive a second control signal, that is different from the first control signal, at a gate electrode thereof, and the sixth transistor is configured to receive a third control signal, that is different from the second control signal and complementary to the first control signal, at a gate electrode thereof.

12. The device as claimed in claim 11, further comprising;
first and second power supply lines configured to be supplied respectively with first and second power supply voltages,
a first driving circuit coupled between the first and second power supply lines and configured to drive the first main input output line to one of the first and second power supply voltages,
a second driving circuit coupled between the first and second power supply lines and configured to drive the second main input output line to one of the first and second power supply voltages,
wherein the power supply node is coupled to the first power supply line.

13. The device as claimed in claim 11, wherein the first conductivity type is a N-channel type and the second conductivity type is a P-channel type.

14. The device as claimed in claim 11, wherein each of the first and second transistors is smaller in current driving ability than each of the third and fourth transistors.

15. The device as claimed in claim 11, wherein each of the first and second transistors is smaller in channel width than each of the third and fourth transistors.

16. A device, comprising;
first and second signal lines;
first and second transistors of a first conductivity type coupled in series between the first and second signal lines and coupled to each other at a first node;
third and fourth transistors of a second conductivity type coupled in series between the first and second lines and coupled to each other at a second node;
a power supply node coupled in common to the first and second nodes;
a fifth transistor of the first conductivity type coupled between the first and second signal lines; and
a sixth transistor of the second conductivity type coupled between the first and second signal lines,
wherein the sixth transistor is configured to be rendered conductive when the first, second and fifth transistors are rendered conductive while the third and fourth transistors are non conductive.

17. The device as claimed in claim 16, further comprising;
first and second power supply lines configured to be supplied respectively with first and second power supply voltages,
a first driving circuit coupled between the first and second power supply lines and configured to drive the first signal line to one of the first and second power supply voltages,
a second driving circuit coupled between the first and second power supply lines and configured to drive the second signal line to one of the first and second power supply voltages,
wherein the power supply node is coupled to the first power supply line.

18. The device as claimed in claim 16, wherein the first conductivity type is a N-channel type and the second conductivity type is a P-channel type.

19. The device as claimed in claim 16, wherein each of the first and second transistors is smaller in current driving ability than each of the third and fourth transistors.

20. The device as claimed in claim 16, wherein each of the first and second transistors is smaller in channel width than each of the third and fourth transistors.

* * * * *